United States Patent
Sun

(10) Patent No.: US 8,950,726 B2
(45) Date of Patent: Feb. 10, 2015

(54) MOUNTING APPARATUS FOR FANS

(75) Inventor: Zheng-Heng Sun, New Taipei (TW)

(73) Assignee: ScienBiziP Consulting(Shenzhen)Co., Ltd., Guangdong (CN)

(*) Notice: Subject to any disclaimer, the term of this patent is extended or adjusted under 35 U.S.C. 154(b) by 190 days.

(21) Appl. No.: 13/564,741

(22) Filed: Aug. 2, 2012

(65) Prior Publication Data

US 2013/0320187 A1    Dec. 5, 2013

(30) Foreign Application Priority Data

May 30, 2012 (CN) .......................... 2012 1 0172293

(51) Int. Cl.
*F04D 29/00* (2006.01)

(52) U.S. Cl.
USPC .................. 248/674; 415/213.1; 361/695

(58) Field of Classification Search
USPC ......... 248/674; 415/213.1, 220, 189, 190, 60, 415/214.1; 361/695, 679.01, 679.41
See application file for complete search history.

(56) References Cited

U.S. PATENT DOCUMENTS

| | | | | |
|---|---|---|---|---|
| 8,366,417 | B2* | 2/2013 | Fan et al. | 417/423.14 |
| 8,449,251 | B2* | 5/2013 | Lu | 415/213.1 |
| 8,596,971 | B2* | 12/2013 | Lu | 415/213.1 |
| 8,632,046 | B2* | 1/2014 | Sun | 248/674 |
| 2008/0145246 | A1* | 6/2008 | Lee et al. | 417/423.14 |
| 2010/0232976 | A1* | 9/2010 | Li | 416/244 R |
| 2012/0138262 | A1* | 6/2012 | Zhang et al. | 165/67 |
| 2013/0323044 | A1* | 12/2013 | Sun | 415/213.1 |

* cited by examiner

*Primary Examiner* — Steven Marsh
(74) *Attorney, Agent, or Firm* — Novak Druce Conolly Bove + Quigg LLP

(57) ABSTRACT

A mounting apparatus includes a bracket and two shafts. The bracket includes a fixing plate defining a number of horizontally arranged vents, for mounting a number of fans to the rear side of the fixing plate, with each vent aligning with one of the fans. The shafts are respectively and horizontally mounted to a top and a middle of a front side of the bracket. A number of shield plates are rotatably connected to the shafts. The shield plates hang vertically under the corresponding shafts by gravity. Each of the vents is covered by two vertically aligned shield plates upon a condition that the gravity of the two shield plates are not overcome by airflows passing through the vents.

10 Claims, 3 Drawing Sheets

MOUNTING APPARATUS FOR FANS

BACKGROUND

1. Technical Field

The present disclosure relates to an apparatus for mounting multiple fans.

2. Description of Related Art

In an electronic device, fans are mounted to a bracket for dissipating heat for electronic components in the electronic device. However, when a fan is broken or not mounted, air pressure in the electronic device changes, which will cause turbulence and air to back flow, adversely influencing heat dissipation from the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
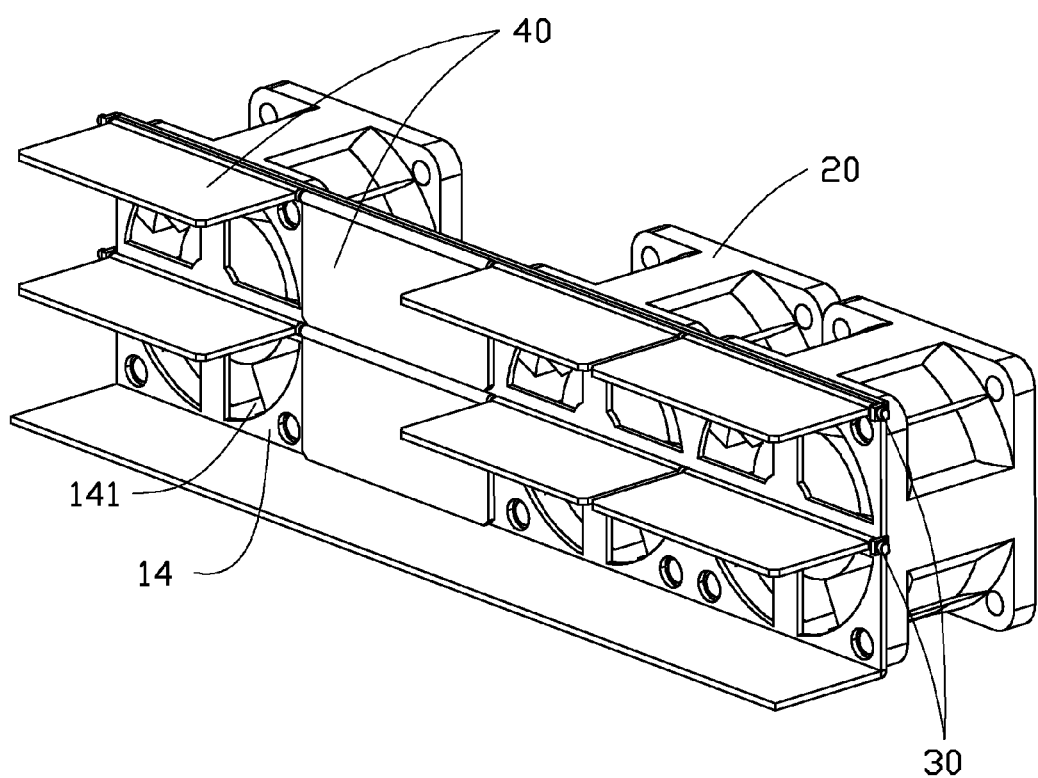
FIG. 1 is an assembled, isometric view of a first embodiment of a mounting apparatus together with a plurality of fans.
Figure 2:
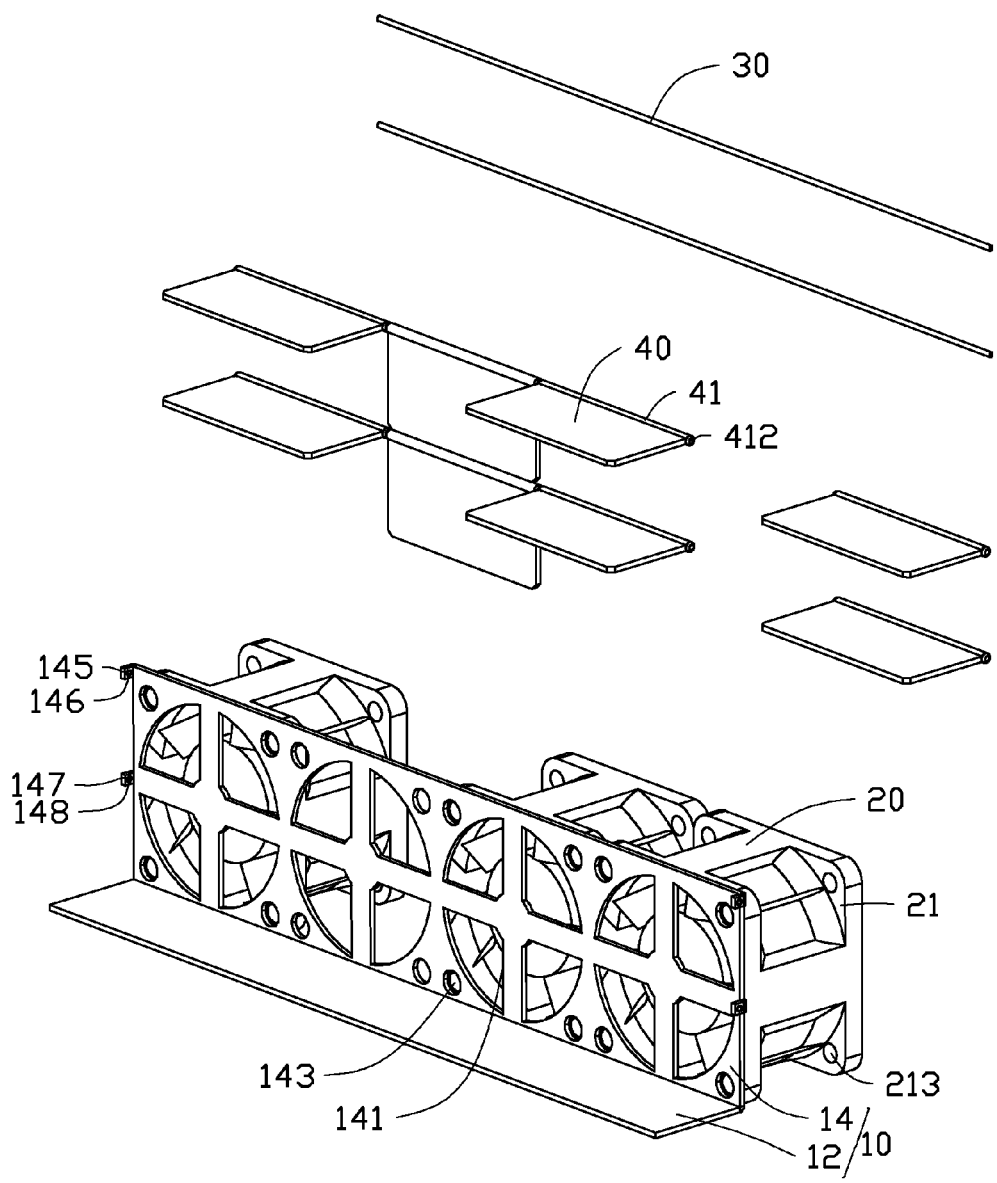
FIG. 2 is an exploded, isometric view of FIG. 1.

FIGS. 1 and 2 show a first embodiment of a mounting apparatus for a plurality of fans 20. The mounting apparatus includes a bracket 10, two shafts 30, and eight substantially rectangular shield plates 40.

Each fan 20 includes two opposite side plates 21. Four fixing holes 213 are defined in four corners of each side plate 21.

The bracket 10 includes an elongated base 12, and a substantially rectangular fixing plate 14 extending upwards from a rear side of the base 12 in a substantially perpendicular manner. Four vents 141 are defined in the fixing plate 14, arranged in a horizontal direction. Four through holes 143 are defined in the fixing plate 14 around each vent 141. Two first connecting portions 145 protrude forward from the tops of opposite ends of the fixing plate 14. A first slot 146 is defined in each first connecting portion 145. Two second connecting portions 147 protrude forward from the midpoints of the opposite ends of the fixing plate 14. A second slot 148 is defined in each second connecting portion 147.

A columnar pivot portion 41 is horizontally formed on a top side of each shield plate 40. A pivot hole 412 is axially defined in each pivot portion 41.

To assemble a fan 20 to the mounting apparatus, one of the side plates 21 abuts the rear side of the fixing plate 14, to allow the fixing holes 213 of the side plate 21 to align with four through holes 143 around one of the vents 141. Four fasteners, such as screws, are extended through the through holes 143 and engaged in the fixing holes 213. Thereby, the fan 20 is fastened to the fixing plate 14 aligning with the vent 141.

According to heat dissipation demands, four fans 20 can be mounted to the fixing plate 14, to allow each of the vents 141 to align with a fan 20, or less than four fans 20 can be mounted to the fixing plate 14, to allow some of the vents 141 to each align with a fan 20.

First ends of the shafts 30 are respectively extended through the first slot 146 and the second slot 148 at one end of the fixing plate 14. The shafts 30 are pushed towards the opposite end of the fixing plate 14, to allow the first end of each shaft 30 to extend through the pivot holes 412 of the four shield plates 40. The first ends of the shafts 30 are respectively extended through the first slot 146 and the second slot 148 at the other end of the fixing plate 14. Opposite ends of each shaft 30 are fixed to the corresponding first connecting portions 145 or second connecting portions 147 by hot melt. Thereby, the shafts 30 are respectively and horizontally mounted to the top and the middle of the fixing plate 14, with the four shield plates 40 rotatably connected to each shaft 30 end to end. The shield plates 40 hang vertically under the corresponding shafts 30 by gravity, allowing each vent 141 to be covered by two vertically aligned shield plates 40.

When the fans 20 operate, airflow from the fans 20 passes through the corresponding vents 141 and is blown towards the shield plates 40 right ahead of the fans 20. The shield plates 40 rotate forward 90 degrees around the corresponding shafts 30, to allow the airflow produced by the fans 20 to pass through.

Before a replacement of a broken fan 20 is completed, the shield plates 40 right in front of the broken fan 20 vertically cover the corresponding vent 141 by means of gravity. Air pressure at the vertical shield plates 40 will not change substantially, so the vertical shield plates 40 can prevent air from flowing back towards the broken fan 20.

When the rear side of a vent 141 is empty, the shield plates 40 right in front of the vent 141 vertically cover the vent 141 by means of gravity, which will prevent air from flowing back towards the vent 141.

Figure 3:
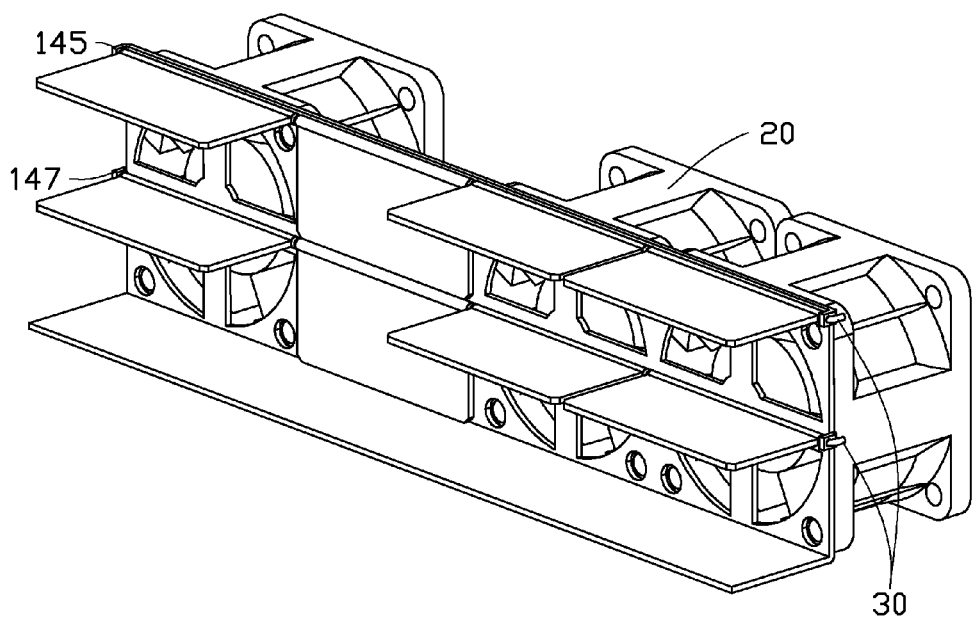
FIG. 3 is an assembled, isometric view of a second embodiment of a mounting apparatus together with a plurality of fans.

FIG. 3 shows a second embodiment of a mounting apparatus for the plurality of fans 20. Opposite ends of each shaft 30 are bent to abut outer sides of the corresponding first connecting portions 145 or second connecting portions 147.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A mounting apparatus for a plurality of fans, comprising:
   a bracket comprising a fixing plate defining a plurality of horizontally arranged vents, for mounting the fans to a rear side of the fixing plate, with each vent to be aligning with one of the fans;
   two shafts respectively and horizontally mounted to a top and a middle of a front side of the bracket; and
   a plurality of shield plates rotatably connected to the shafts, wherein the shield plates hang vertically under the corresponding shafts by gravity, each of the vents is covered by two vertically aligned shield plates upon a condition that the gravity of the two shield plates is not overcome by airflows passing through the vents;
   wherein two first connecting portions protrude forward from tops of opposite ends of the fixing plate, opposite ends of one of the shafts are respectively fixed to the first connecting portions, two second connecting portions protrude forward from midpoints of the opposite ends of the fixing plate, and opposite ends of the other shaft are respectively fixed to the second connecting portions.

2. The mounting apparatus of claim 1, wherein each first connecting portion defines a first slot, and each second connecting portion defines a second slot, the opposite ends of said one of the shafts are respectively extended through the first slots and fixed to the first connecting portions by hot melt, and the opposite ends of the other shaft are respectively extended through the second slots and fixed to the second connecting portions by hot melt.

3. The mounting apparatus of claim 1, wherein each first connecting portion defines a first slot, and each second connecting portion defines a second slot, the opposite ends of said one of the shafts are respectively extended through the first slots and bent to abut outer sides of the first connecting portions, and the opposite ends of the other shaft are respectively extended through the second slots and bent to abut outer sides of the second connecting portions.

4. The mounting apparatus of claim 1, wherein each shield plate is substantially rectangular, a columnar pivot portion is horizontally formed on a top side of each shield plate, and a pivot hole is axially defined in each pivot portion through which a corresponding shaft extends.

5. The mounting apparatus of claim 1, wherein the bracket further comprises a base connected to a bottom side of the fixing plate in a substantially perpendicular manner.

6. A mounting apparatus for a plurality of fans, comprising:
   a fixing plate for mounting a plurality of fans to a rear side of the fixing plate, wherein a plurality of horizontally arranged vents is defined in the fixing plate, with each vent aligning with one of the fans;
   a first shaft horizontally mounted to a top of a front side of a bracket;
   a plurality of first shield plates rotatably connected to the first shaft, wherein the first shield plates hang vertically under the first shaft by gravity, an upper half of each vent is covered by one of the first shield plates upon a condition that the gravity of the first shield plates is not overcome by airflows passing through the vents;
   a second shaft horizontally mounted to a middle of the front side of the bracket; and
   a plurality of second shield plates rotatably connected to the second shaft, wherein the second shield plates hang vertically under the second shaft by gravity, a lower half of each vent is covered by one of the second shield plates upon a condition that the gravity of the second shield plates are not overcome by airflows passing through the vents;
   wherein two first connecting portions protrude forward from tops of opposite ends of the fixing plate, opposite ends of the first shaft are respectively fixed to the first connecting portions, two second connecting portions protrude forward from midpoints of the opposite ends of the fixing late and opposite ends of the second shaft are respectively fixed to the second connecting portions.

7. The mounting apparatus of claim 6, wherein each first connecting portion defines a first slot, and each second connecting portion defines a second slot, the opposite ends of the first shaft are respectively extended through the first slots and fixed to the first connecting portions by hot melt, and the opposite ends of the second shaft are respectively extended through the second slots and fixed to the second connecting portions by hot melt.

8. The mounting apparatus of claim 6, wherein each first connecting portion defines a first slot, and each second connecting portion defines a second slot, the opposite ends of the first shaft are respectively extended through the first slots and bent to abut outer sides of the first connecting portions, and the opposite ends of the second shaft are respectively extended through the second slots and bent to abut outer sides of the second connecting portions.

9. The mounting apparatus of claim 6, wherein each of the first and second shield plates is substantially rectangular, a columnar pivot portion is horizontally formed on a top side of each of the first and second shield plates, a pivot hole is axially defined in each pivot portion, the first shaft is extended through the pivot holes of the first shield plates, and the second shaft is extended through the pivot holes of the second shield plates.

10. The mounting apparatus of claim 6, wherein a base is connected to a bottom side of the fixing plate in a substantially perpendicular manner.

\* \* \* \* \*